US 6,691,769 B2

(12) United States Patent
Johnson et al.

(10) Patent No.: US 6,691,769 B2
(45) Date of Patent: Feb. 17, 2004

(54) HEAT SINK FOR CONVECTION COOLING IN HORIZONTAL APPLICATIONS

(75) Inventors: Eric Arthur Johnson, Greene, NY (US); Randall Joseph Stutzman, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/924,210

(22) Filed: Aug. 7, 2001

(65) Prior Publication Data

US 2003/0029601 A1 Feb. 13, 2003

(51) Int. Cl.[7] ................................................ F28F 7/00
(52) U.S. Cl. ...................................... 165/80.3; 165/185
(58) Field of Search ............................... 165/80.3, 185, 165/125, 128, 129, 131; 361/704, 709, 710, 703, 697; 257/722; 174/16.3

(56) References Cited

U.S. PATENT DOCUMENTS

| | | | | |
|---|---|---|---|---|
| 5,172,755 A | * | 12/1992 | Samarov | 165/80.3 |
| 5,761,044 A | * | 6/1998 | Nakajima | 361/719 |
| 5,884,692 A | * | 3/1999 | Lee et al. | 165/80.3 |
| 6,011,299 A | * | 1/2000 | Brench | 257/660 |
| 6,257,327 B1 | * | 7/2001 | Rembold et al. | 165/185 |
| 6,315,038 B1 | * | 11/2001 | Chiu | 165/185 |
| 6,390,181 B1 | * | 5/2002 | Hall et al. | 165/80.3 |
| 6,446,708 B1 | * | 9/2002 | Lai | 165/80.3 |

FOREIGN PATENT DOCUMENTS

| JP | 0019643 | * | 2/1981 | H01L/23/36 |
|---|---|---|---|---|

* cited by examiner

Primary Examiner—Henry Bennett
Assistant Examiner—Nihir Patel
(74) Attorney, Agent, or Firm—Ronald A. D'Alessandro; Hoffman, Warnick & D'Alessandro LLC

(57) ABSTRACT

A heat sink for free convection cooling in horizontal applications is provided. Specifically, the heat sink includes a plurality of spaced apart cooling fins, which are supported by an angled base. The cooling fins are transversely attached to the base and extend in a substantially vertical direction. In addition, the cooling fins extend beyond an outer edge of the base so that air can flow horizontally beneath the base and then vertically through the spaced apart cooling fins.

18 Claims, 2 Drawing Sheets

HEAT SINK FOR CONVECTION COOLING IN HORIZONTAL APPLICATIONS

BACKGROUND OF THE INVENTION

1. Technical Field

The present invention generally relates to a heat sink. More particularly, the present invention relates to a heat sink for free convection cooling in horizontal applications.

2. Background Art

As consumer electronic products become more advanced, the need to provide improved cooling of internal electronic components increases. Specifically, products such as laptop computers are being designed to have increased capabilities while being smaller in size. In previous larger products, forced convection cooling was often implemented. Forced convection cooling generally includes the use of a heat sink and a fan. For example, the heat sink could be positioned between the fan and a surface to be cooled (e.g., a microelectronic device). As the fan creates an air flow through the heat sink, heat is transferred from the surface. Unfortunately, such fans are often bulky and significantly add to the cost and size of the product. In addition, there are often a limited number of locations within a product where a fan can be placed.

Heretofore, many have attempted to solve these problems by using heat sinks with free convection cooling. In these applications the base of the heat sink is generally mounted in thermal contact with the surface to be cooled. Fins or pins attached to the base aid in the transfer of heat from the surface. However, the entire array of fins is generally supported by a solid base: when used in a horizontal application the base prevents air from flowing vertically through the fins. Thus, heat can only be removed from air that penetrates the sides of the heat sink.

In addition, existing heat sinks often utilize bases that are entirely flat. Although this could allow the base to be positioned flatly on the surface to be cooled, it unnecessarily restricts air flow around or under the base. Since air flow is the driving force behind convection cooling, and free convection cooling does not utilize a fan or the like, the cooling operation with such existing devices is less efficient.

In view of the forgoing, there exists a need for a heat sink for convection cooling in horizontal applications such as microelectronic devices. A need also exists for a heat sink that has a base and spaced apart cooling fins. A further need exists for the cooling fins to extend beyond an outer edge of the base so that air can flow horizontally beneath the base and then vertically through the spaced apart cooling fins. In addition, a further need exists for the base to be angled in order to increase the amount of air that can flow around and under the base for improved cooling. Furthermore, a need exists for such a heat sink to have a geometry that is compatible with extrusion in order to minimize its cost.

SUMMARY OF THE INVENTION

The present invention overcomes the problems of existing devices by providing a heat sink for free convection cooling in horizontal applications such as microelectronic devices. Generally, the heat sink includes spaced apart cooling fins, and an angled base supporting the cooling fins. Preferably, the cooling fins extend beyond an outer edge of the angled base so that air can flow horizontally beneath the base and then vertically through the spaced apart cooling fins.

According to a first aspect of the present invention, a heat sink for convection cooling in horizontal applications is provided. The heat sink comprises: (1) a plurality of spaced apart cooling fins, wherein each cooling fin has a center portion and opposing outer portions; and (2) an angled base supporting the center portions of the cooling fins, wherein the outer portions of the cooling fins extend beyond an outer edge of the base.

According to a second aspect of the present invention, a heat sink for convection cooling in horizontal applications is provided. The heat sink comprises: (1) a plurality of spaced apart cooling fins, wherein each cooling fin has a center portion and opposing outer portions; (2) an angled base supporting the center portions of the cooling fins, wherein the outer portions of the cooling fins extend beyond an outer edge of the base so that air can flow horizontally beneath the base and then vertically through the spaced apart cooling fins; and (3) wherein the cooling fins are transversely attached to the base and extend from the base in a substantially vertical direction.

According to a third aspect of the present invention, a heat sink for convection cooling in horizontal applications is provided. The heat sink comprises: (1) a plurality of spaced apart cooling fins, wherein each cooling fin has a center portion and opposing outer portions; (2) a base supporting the center portions of the cooling fins, wherein the base comprises a central region for receiving a surface to be cooled and opposing end regions adjacent the central region, and wherein a bottom surface of each end region is angled with respect to the central region; and (3) wherein the outer portions of the cooling fins extend beyond an outer edge of the base so that air can flow horizontally beneath the base and then vertically through the spaced apart cooling fins.

According to a fourth aspect of the present invention, a heat sink for convection cooling in horizontal applications is provided. The heat sink comprises: (1) a plurality of spaced apart cooling fins, wherein each cooling fin has a center portion and opposing outer portions; (2) an angled base supporting the center portions of the cooling fins, wherein the base comprises a central region for receiving a surface to be cooled and opposing end regions extending from the central region, wherein the central region has a greater width than the end regions; and (3) wherein the outer portions of the cooling fins extend beyond an outer edge of the base so that air can flow horizontally beneath the base and then vertically through the spaced apart cooling fins.

According to a fifth aspect of the present invention, a heat sink for convection cooling in horizontal applications is provided. The heat sink comprises: (1) a plurality of spaced apart cooling fins, wherein each cooling fin has a center portion and opposing outer portions; (2) a base supporting the center portions of the cooling fins, wherein the base includes a central region for receiving a surface to be cooled and opposing end regions adjacent the central region, wherein the central region has a greater width than the end regions, and wherein a bottom surface of each end region is angled with respect to the central region; and (3) wherein the outer portions of the cooling fins extend beyond an outer edge of the base so that air can flow horizontally beneath the base and then vertically through the spaced apart fins, and wherein the cooling fins are transversely attached on the base and extend in a substantially vertical direction.

According to a sixth aspect of the present invention, a heat sink for convection cooling in horizontal applications is provided. The heat sink comprises: (1) a plurality of spaced apart cooling fins, wherein each cooling fin has a center portion and opposing outer portions; (2) an angled base supporting the center portions of the cooling fins, wherein the outer portions of the cooling fins extend beyond an outer edge of the base so that air can flow horizontally beneath the base and then vertically through the spaced apart cooling fins; and (3) wherein the base is horizontally mounted on a surface to be cooled.

According to a seventh aspect of the present invention, a heat sink for convection cooling in horizontal applications is provided. The heat sink comprises: (1) a plurality of spaced apart cooling fins, wherein each cooling fin has a center portion and opposing outer portions; (2) a base supporting the center portions of the cooling fins, wherein the base comprises a central region for receiving a surface to be cooled and opposing end regions adjacent the central region, and wherein a bottom surface of each end region is angled with respect to the central region; and (3) wherein the outer portions of the cooling fins extend beyond an outer edge of the base so that air can flow horizontally beneath the base and then vertically through the spaced apart cooling fins, and wherein the cooling fins are transversely attached to the base and extend from the base in a substantially vertical direction.

According to an eighth aspect of the present invention, a heat sink for convection cooling in horizontal applications is provided. The heat sink comprises: (1) a plurality of spaced apart cooling fins, wherein each cooling fin has a center portion and opposing outer portions; (2) an angled base supporting the center portions of the cooling fins, wherein the base comprises a central region for receiving a surface to be cooled and opposing end regions adjacent the central region, wherein the central region has a greater width than the end regions; and (3) wherein the outer portions of the cooling fins extend beyond an outer edge of the base so that air can flow horizontally beneath the base and then vertically through the spaced apart cooling fins, and wherein the cooling fins are transversely attached to the base and extend in a substantially vertical direction.

Therefore, a preferred embodiment of the present invention provides a heat sink for free convection cooling in horizontal applications. The heat sink includes a spaced apart cooling fins, and an angled base supporting the cooling fins.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
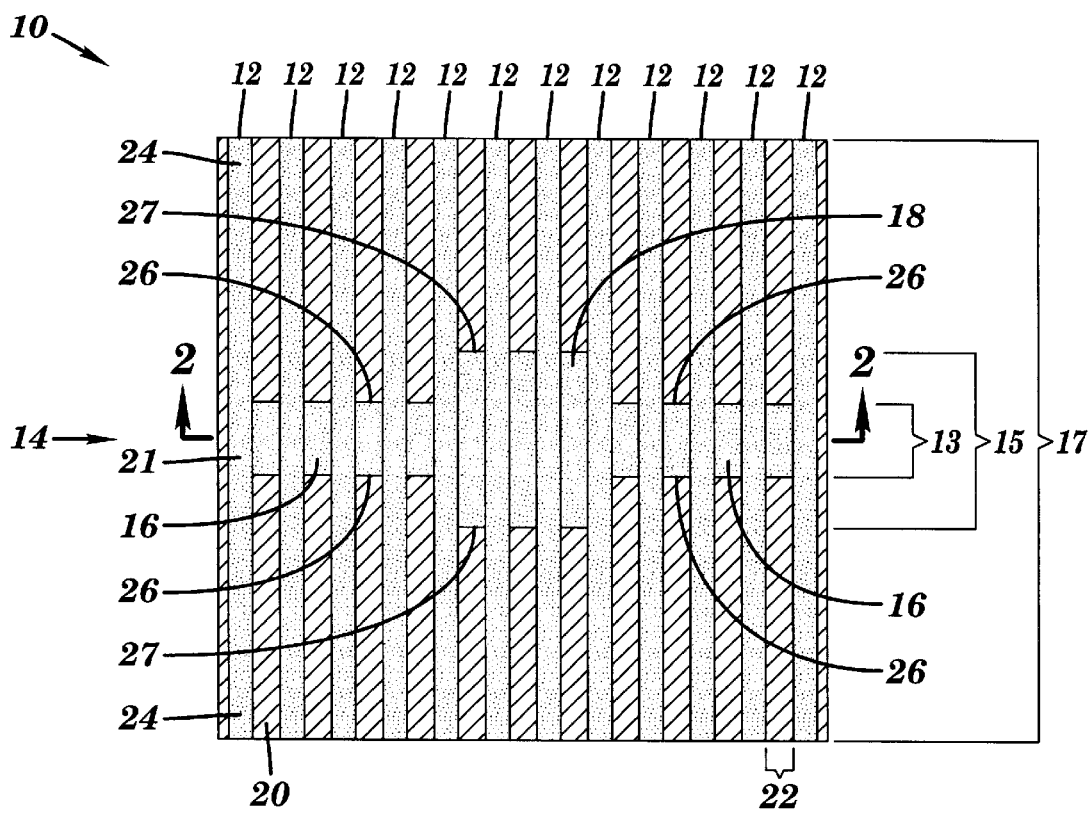
FIG. 1 depicts a top view of a heat sink, according to the present invention.

It is noted that the drawings of the invention are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE DRAWINGS

In general, the present invention comprises a heat sink for free convection cooling in horizontal applications (e.g., microelectronic devices). Specifically, a heat sink according to present invention generally includes spaced apart cooling fins attached to an angled base. The cooling fins are transversely attached to the base so that they extend past an outer edge of the base. This allows air to flow horizontally beneath the base and then vertically through the spaced apart cooling fins. Although the present invention is described as removing heat by unforced or free convection cooling, it should be understood that it could be applied in forced convection cooling (e.g., by using a fan).

Referring now to FIG. 1, a heat sink 10 according to two possible embodiments of the present invention is shown. As depicted, heat sink 10 includes spaced apart cooling fins 12 and base 14. Base 14 includes opposing end regions 16 and central region 18. As will be further described below, end regions 16 may have a width 13 that is smaller than a width 15 of central region. Each cooling fin 12 includes centrer portion 21 and opposing outer portions 24. As depicted, cooling fins 12 are transversely attached to base 14, with base 14 supporting center portions 21 of cooling fins 12. This configuration allows outer portions 24 of cooling fins 12 to extend well beyond outer edges 26 and 27 of end regions 16 and central region 18. Specifically, cooling fins 12 have a length 17 that is greater than widths 13 and 15 of base 14.

Heat sink 10 provides convection cooling for horizontal applications such as microelectronic devices. Specifically, heat sink 10 of FIG. 1 is shown horizontally mounted over substrate 20. Cooling fins 12 are preferably separated by gaps 22. This allows air to flow horizontally beneath the fins 12 and base 14 and then vertically through spaced apart cooling fins 12 (i.e., through gaps 22). As explained above, the bases in existing devices extend along the entire length of the fins. With such a configuration, air cannot rise vertically across the entire surface of the cooling fins. In contrast, the air must flow in through the sides of the heat sink. When this occurs, the outer portions of the fins remove more heat than the center portions, an inefficient configuration.

Heat sink 10 is preferably formed as an integral unit by extrusion and/or machining from aluminum or copper. However, it should be understood that the process used to form heat sink 10, as well as the material thereof, are not intended to be limiting. Moreover, as will be further described below, base 14 could be machined down so that it has a lower height than cooling fins 12.

Figure 2:
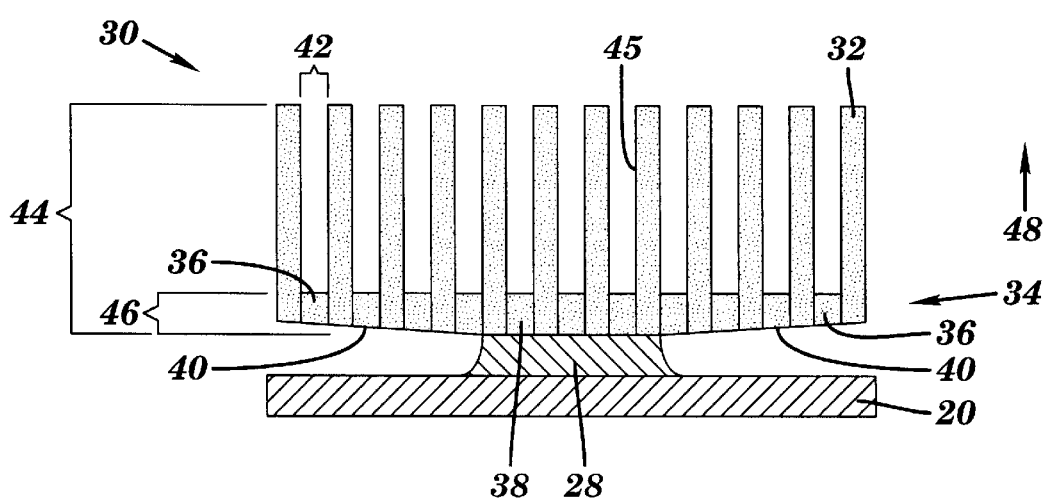
FIG. 2 depicts a cross-sectional view taken along lines 2—2 of FIG. 1, according to a first embodiment of the present invention.

Referring now to FIG. 2, a cross-sectional view taken along lines 2—2 of FIG. 1, according to a first embodiment of the present invention is shown. As depicted, heat sink 30 is horizontally mounted on chip 28, which itself is mounted on substrate 20. Moreover, spaced apart cooling fins 32 are transversely attached to base 34 and extend from base 34 in a substantially vertical direction 48. As indicated above, base 34 has opposing end regions 36 and central region 38. Central region 38 is substantially flat for receiving chip 28. End regions 36 preferably have bottom surfaces 40 that are angled with respect to central region 38 and/or chip 28. This provides for improved air flow beneath base 34. Improved air flow allows more heat to be efficiently removed from chip 28. It should be appreciated that the optimum angle for bottom surfaces 40 depends on several variables including heat-sink size, power dissipated by the chip and chip dimensions.

As indicated above, outer portions of fins 32 extend horizontally beyond an outer edge of base 34. Accordingly, air can flow horizontally beneath the fins 12 and base 14 and then vertically through spaced apart cooling fins 32 (i.e., around base 14). In addition, as shown in FIG. 2, base 34 is preferably machined down so that upper portions 45 of cooling fins 32 extend vertically above base 34 (in addition to horizontally as shown in FIG. 1). Specifically, cooling fins 32 have a height 44 greater than a height 46 of base 34. This configuration is preferably formed by extruding heat sink 30 and then machining base 34 down to height 46. By reducing height 46 of base 34, air can flow around base 34, and contact the center portions of cooling fins 32 (i.e., the portions of cooling fins 32 that overlap base 34).

Figure 3:
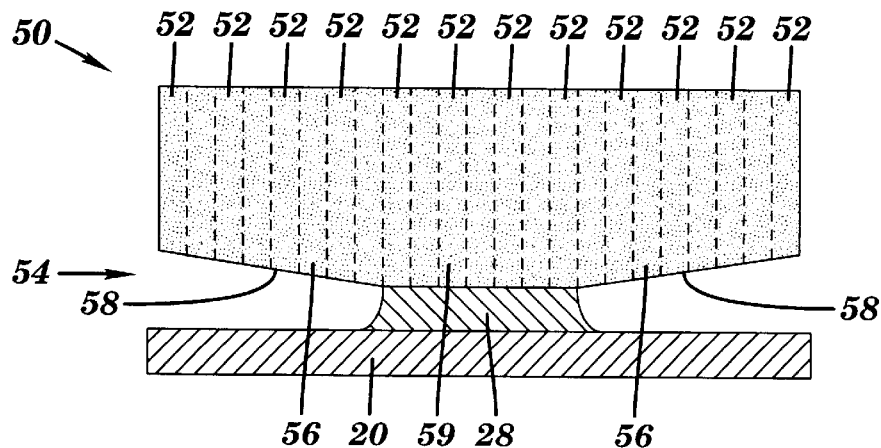
FIG. 3 depicts a cross-sectional view taken along lines 2—2 of FIG. 1, according to a second embodiment of the present invention.

Referring now to FIG. 3, a cross-sectional view of heat sink 50 taken along lines 2—2 of FIG. 1, according to a second embodiment of the present invention is shown. In this embodiment, heat sink 50 is formed, but base 54 is not machined down. Accordingly, base 54 has a height equal to that of the cooling fins so that this cross-sectional view resembles a solid block. Cooling fins 52 are shown in FIG. 3 in phantom to demonstrate that the outer portions thereof (i.e., the portions that extend beyond the outer edges of base 54) are still spaced apart. Thus, air can still flow horizontally beneath the fins 52 and base 54 and then vertically through the spaced-apart outer portions of cooling fins 52. Similar to heat sink 10, bottom surfaces 58 of end regions 56 of base 54 may be angled to provide improved air flow. Moreover, central region 59, is substantially flat or horizontal to receive chip 28. By not machining base 54, the costs associated with producing heat sink 50 are reduced.

Figure 4:
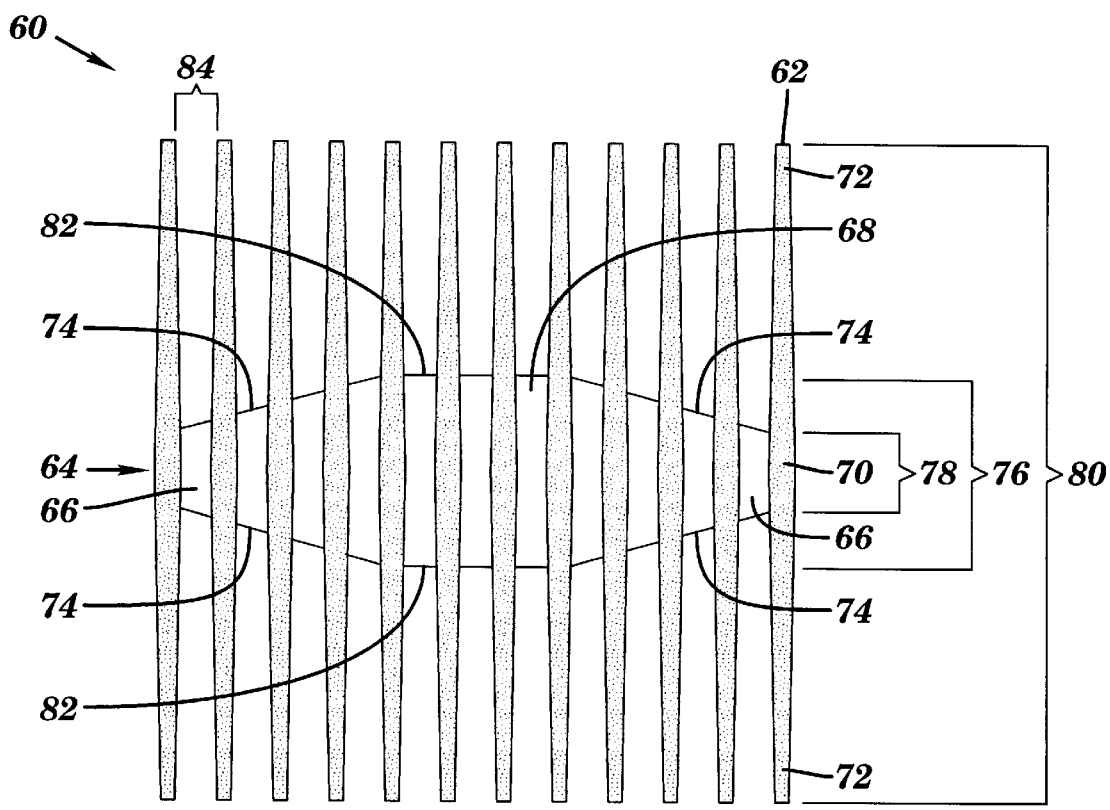
FIG. 4 depicts a top view of a heat sink, according to a third embodiment of the present invention.

Referring now to FIG. 4, a top view of a heat sink 60 according to a third embodiment of the present invention is shown. Heat sink 60 has components and construction similar to heat sink 10 of FIG. 1. Specifically, heat sink 60 includes spaced apart cooling fins 62 each having center portion 70 and opposing outer portions 72. Base 64 supports cooling fins 62 and includes opposing end regions 66 and central region 68. Similar to heat sink 10, central region 68 of heat sink 60 preferably has a width 76 that is greater than width 78 of end regions 66. This allows central region 68 to have sufficient surface area to receive a surface to be cooled (e.g., a chip not shown in FIG. 4 for clarity purposes). In addition, heat sink 60 is preferably formed from aluminum or copper as an integral unit by extrusion and/or machining. As such, cooling fins 62 are transversely attached to base 64 and extend from base 64 in a substantially vertical direction.

As depicted, outer portions 72 of cooling fins 62 extend well beyond outer edges 74 and 82 of end regions 66 and central region 68, respectively. Specifically, cooling fins 62 have a length 80 that is greater than widths 76 and 78 of base 64. Cooling fins 62 are preferably separated by gaps 84. This allows air to flow horizontally beneath the fins 62 and base 64 and then vertically through spaced apart cooling fins 62 (i.e., through gaps 84). Thus, the air flow is increased at the central portion of the fins 62 adjacent to base 64. As explained above, bases in existing devices extend along the entire length of the fins. With such a configuration, air cannot rise vertically past the base and through the cooling fins. In contrast, the air must flow in through the sides of the heat sink. When this occurs, the outer portions of the fins removed more heat than the center portions, an inefficient configuration.

Heat sink 60 differs from heat sink 10 in that outer portions 72 of cooling fins 62 and outer edges 74 of end regions 66 are tapered. As indicated above, the extent to which cooling fins 62 extend beyond outer edges 74 and 82 of base 64 (i.e., the relative narrow widths 76 and 78 of base 64 compared to length 80 of cooling fins 62), increases the amount of air that flows through the central portion of fins 62, adjacent to base 64. Thus, the center portions 70 of cooling fins 62 will remove more heat than in existing devices. As such, outer portions 72 of cooling fins 62 can be tapered to optimize the volume flow of air between them. In addition, end regions 66 of base 64 are tapered so that air can flow more efficiently around base 64. Specifically, central region 68 has a larger width 76 than end regions 66 because central region 68 must receive the surface to be cooled. Conversely, the primary role of end regions 66 is to support, and to conduct heat into, cooling fins 62. Thus, end regions 66 have a width 78 that maximizes the efficiency of the heat sink, 60. Moreover, the smaller the width 78 of end regions 66, the more air can flow around base to center portions 70 of cooling fins 62. It should be understood that the degree of tapering shown in FIG. 4 is intended to be illustrative only and the precise degree of tapering could vary depending on the application of heat sink 60. For example, use of heat sink 60 on a larger surface to be cooled could result in a higher degree of tapering.

Base 64 of heat sink 60 can be machined down similar to heat sink 10 shown in FIG. 2, or can be left intact similar to heat sink 50 of FIG. 3. The advantages of each are discussed above. However, in either case, base 64 is preferably angled to provide improved air flow beneath end regions 66. Specifically, similar to heat sinks 10, 30, and 40, each end region 66 preferably includes an angled bottom surface. The angle of the bottom surfaces could vary depending on how heat sink 60 is utilized.

The foregoing description of the preferred embodiments of this invention has been presented for purposes of illustration and description. It is not intended to be exhaustive or to limit the invention to the precise form disclosed, and obviously, many modifications and variations are possible.

Such modifications and variations that may be apparent to a person skilled in the art are intended to be included within the scope of this invention as defined by the accompanying claims.

What is claimed is:

1. A heat sink for convection cooling in horizontal applications, comprising:

a plurality of spaced apart cooling fins, wherein each cooling fin has a center portion and opposing outer portions; and an angled base supporting the center portions of the cooling fins, wherein the outer portions of the cooling fins extend beyond an outer edge of the base, wherein the angled base comprises a central region for receiving a surface to be cooled and opposing end regions adjacent the central region, and wherein a bottom surface of each of the opposing end regions is angled with respect to the central region.

2. The heat sink of claim 1, wherein the central region has a greater width than the opposing end regions.

3. The heat sink of claim 1, wherein the cooling fins are transversely attached on the base and extend from the base in a substantially vertical direction.

4. A heat sink for convection cooling in horizontal applications, comprising:

a plurality of spaced apart cooling fins, wherein each cooling fin has a center portion and opposing outer portions;

an angled base supporting the center portions of the cooling fins, wherein the outer portions of the cooling fins extend beyond an outer edge of the base so that air can flow horizontally beneath the base and then vertically through the spaced apart cooling fins; and wherein the cooling fins are transversely attached to the base and extend from the base in a substantially vertical direction, wherein the base comprises a central region for receiving a surface to be cooled and opposing end regions adjacent the central region, and wherein a bottom surface of each of the opposing end regions is angled with respect to the central region.

5. The heat sink of claim 4, wherein the base is angled with respect to the surface to be cooled.

6. The heat sink of claim 5, wherein the central region has a greater width than the end regions.

7. A heat sink for convection cooling in horizontal applications, comprising:
   a plurality of spaced apart cooling fins, wherein each cooling fin has a center portion and opposing outer portions;
   a base supporting the center portions of the cooling fins, wherein the base comprises a central region for receiving a surface to be cooled and opposing end regions adjacent the central region, and wherein a bottom surface of each end region is angled with respect to the central region; and
   wherein the outer portions of the cooling fins extend beyond an outer edge of the base so that air can flow horizontally beneath the base and then vertically through the spaced apart cooling fins.

8. The heat sink of claim 7, wherein the central region of the base has a greater width than the opposing end regions of the base.

9. The heat sink of claim 7, wherein the base is horizontally mounted on the surface to be cooled.

10. A heat sink for convection cooling of microelectronic devices, comprising:
    a plurality of spaced apart cooling fins, wherein each cooling fin has a center portion and opposing outer portions;
    an angled base supporting the center portions of the cooling fins, wherein the base comprises a central region for receiving a surface to be cooled and opposing end regions extending from the central region, wherein the central region has a greater width than the end regions; and
    wherein the outer portions of the cooling fins extend beyond an outer edge of the base so that air can flow horizontally beneath the base and then vertically through the spaced apart cooling fins.

11. The heat sink of claim 10, wherein a bottom surface of each opposing end region is angled with respect to the central region.

12. A heat sink for convection cooling in horizontal applications, comprising:
    a plurality of spaced apart cooling fins, wherein each cooling fin has a center portion and opposing outer portions;
    a base supporting the center portions of the cooling fins, wherein the base includes a central region for receiving a surface to be cooled and opposing end regions adjacent the central region, wherein the central region has a greater width than the end regions, and wherein a bottom surface of each end region is angled with respect to the central region; and
    wherein the outer portions of the cooling fins extend beyond an outer edge of the base so that air can flow horizontally beneath the base and then vertically through the spaced apart fins, and wherein the cooling fins are transversely attached on the base and extend in a substantially vertical direction.

13. The heat sink of claim 12, wherein the base is horizontally mounted on the surface to be cooled.

14. A heat sink for convection cooling in horizontal applications, comprising:
    a plurality of spaced apart cooling fins, wherein each cooling fin has a center portion and opposing outer portions;
    an angled base supporting the center portions of the cooling fins, wherein the outer portions of the cooling fins extend beyond an outer edge of the base so that air can flow horizontally beneath the base and then vertically through the spaced apart cooling fins; and
    wherein the angled base comprises a central region and opposing end regions adjacent the central region, and wherein a bottom surface of each of the opposing end regions is angled with respect to the central region.

15. The heat sink of claim 14, wherein the central region has a greater width than the end regions.

16. The heat sink of claim 14, wherein the cooling fins are transversely attached on the base and extend in a substantially vertical direction.

17. A heat sink for convection cooling in horizontal applications, comprising:
    a plurality of spaced apart cooling fins, wherein each cooling fin has a center portion and opposing outer portions;
    a base supporting the center portions of the cooling fins, wherein the base comprises a central region for receiving a surface to be cooled and opposing end regions adjacent the central region, and wherein a bottom surface of each end region is angled with respect to the central region; and
    wherein the outer portions of the cooling fins extend beyond an outer edge of the base so that air can flow horizontally beneath the base and then vertically through the spaced apart cooling fins, and wherein the cooling fins are transversely attached to the base and extend from the base in a substantially vertical direction.

18. A heat sink for convection cooling of microelectronic devices, comprising:
    a plurality of spaced apart cooling fins, wherein each cooling fin has a center portion and opposing outer portions;
    an angled base supporting the center portions of the cooling fins, wherein the base comprises a central region for receiving a surface to be cooled and opposing end regions adjacent the central region, wherein the central region has a greater width than the end regions; and
    wherein the outer portions of the cooling fins extend beyond an outer edge of the base so that air can flow horizontally beneath the base and then vertically through the spaced apart cooling fins, and wherein the cooling fins are transversely attached to the base and extend in a substantially vertical direction.

* * * * *